(12) United States Patent  
Chen

(10) Patent No.: US 7,777,127 B2  
(45) Date of Patent: Aug. 17, 2010

(54) FLEXIBLE SOLAR CELL

(75) Inventor: Ga-Lane Chen, Santa Clara, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 299 days.

(21) Appl. No.: 11/933,941

(22) Filed: Nov. 1, 2007

(65) Prior Publication Data

US 2009/0025790 A1    Jan. 29, 2009

(30) Foreign Application Priority Data

Jul. 26, 2007    (CN)    .................. 2007 1 0201185

(51) Int. Cl.
*H01L 31/00*    (2006.01)

(52) U.S. Cl. .................. 136/252; 136/262; 136/264; 136/265

(58) Field of Classification Search .................. 136/252, 136/262, 264, 265
See application file for complete search history.

(56) References Cited

U.S. PATENT DOCUMENTS

| | | | | | |
|---|---|---|---|---|---|
| 4,365,107 | A | * | 12/1982 | Yamauchi | .................. 136/258 |
| 4,638,111 | A | * | 1/1987 | Gay | .................. 136/249 |
| 5,034,333 | A | * | 7/1991 | Kim | .................. 438/96 |
| 5,573,601 | A | * | 11/1996 | Saitoh et al. | .................. 136/258 |
| 6,072,117 | A | | 6/2000 | Matsuyama et al. | |
| 6,121,541 | A | * | 9/2000 | Arya | .................. 136/255 |
| 7,053,294 | B2 | * | 5/2006 | Tuttle et al. | .................. 136/265 |
| 2004/0053431 | A1 | * | 3/2004 | Chang et al. | .................. 438/30 |
| 2007/0193623 | A1 | * | 8/2007 | Krasnov | .................. 136/252 |

FOREIGN PATENT DOCUMENTS

WO    2006/053129 A2    5/2006

* cited by examiner

*Primary Examiner*—Jessica L Ward  
*Assistant Examiner*—Jacky Yuen  
(74) *Attorney, Agent, or Firm*—Jeffrey T. Knapp

(57) ABSTRACT

The present invention relates to a flexible solar cell (10). The flexible solar cell includes a Al—Mg alloy substrate (11) having a first surface (110) and an opposing second surface (111). A first electrode layer (12), a semiconductor layer (13), and a second electrode layer (14), are sequentially formed on the first surface of the Al—Mg alloy substrate.

9 Claims, 3 Drawing Sheets

FLEXIBLE SOLAR CELL

BACKGROUND

1. Technical Field

The present invention relates to a flexible solar cell.

2. Description of the Related Art

Photovoltaic devices, i.e., solar cells, are capable of converting solar radiation into usable electrical energy. The energy conversion occurs as the result of what is known as the photovoltaic effect. Solar radiation impinging on a solar cell and absorbed by an active region of semiconductor material generates electricity.

Solar cell offers a clean and effectively inexhaustible source of energy. Particularly, solar cell installed on a roof of a house had been recently proposed and gradually progressed to spread. However, a substrate of the solar cell is usually made of single-crystal silicon, poly-crystal silicon or glass, which is fragile, bulky and inflexible. Such characters minimize its acceptability in application on the roof.

What is needed, therefore, is a solar cell, lightweight and flexible.

SUMMARY

A flexible solar cell according to one preferred embodiment includes an Al—Mg alloy substrate. A first electrode layer is formed on the Al—Mg alloy substrate. A semiconductor layer is formed on the first electrode layer. A second electrode layer is formed on the semiconductor layer.

Advantages and novel features will become more apparent from the following detailed description of the present flexible solar cell, when taken in conjunction with the accompanying drawings.

BRIEF DESCRIPTION OF THE DRAWINGS

Many aspects of the present flexible solar cell can be better understood with reference to the following drawings. The components in the drawings are not necessarily drawn to scale, the emphasis instead being placed upon clearly illustrating the principles of the present flexible solar cell. Moreover, in the drawings, like reference numerals designate corresponding parts throughout the several views.

Figure 1:
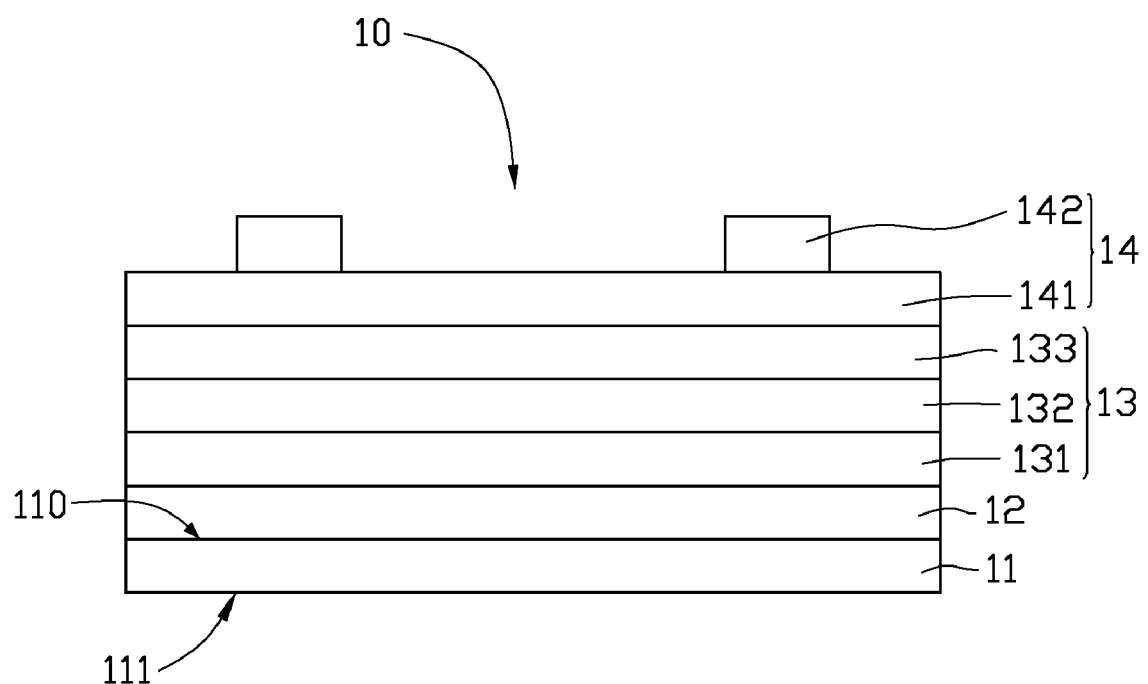
FIG. 1 is a schematic view of a flexible solar cell in accordance with a first present embodiment.

Corresponding reference characters indicate corresponding parts throughout the drawings. The exemplifications set out herein illustrate at least one present embodiment of the present flexible solar cell, in one form, and such exemplifications are not to be construed as limiting the scope of the invention in any manner.

DETAILED DESCRIPTION OF THE EMBODIMENT

Reference will now be made to the drawings to describe present embodiments of the present flexible solar cell in detail.

Referring to FIG. 1, a flexible solar cell 10 with a first present embodiment is shown. The flexible solar cell 10 includes a flexible metallic substrate 11 having a first surface 110 and an opposing second surface 111. A first electrode layer 12 is formed on the first surface 110 of the flexible metallic substrate 11. A semiconductor layer 13 is formed on the first electrode layer 12. A second electrode layer 14 is formed on the semiconductor layer 13. The second electrode layer 14 has a reversal polarity relative to the first electrode layer 12.

In the present embodiment, the flexible metallic substrate 11 is a flexible alloy of aluminum and magnesium (Al—Mg alloy) foil. The flexible metallic substrate 11 has a thickness in a range from about 10 μm to about 100 μm.

The first electrode layer 12 can be formed on the first surface 110 of the flexible substrate 11 by a sputtering process or a depositing process. A material of the first electrode layer 12 can be selected from the group consisting of silver (Ag), copper (Cu), Al, Al—Cu alloy, and alloy of copper and molybdenum (Cu—Mo alloy). A thickness of the first electrode layer 12 is in a range from about 0.1 μm to about 10 μm.

In the present embodiment, the semiconductor layer 13 includes a p-type semiconductor layer 131, an n-type semiconductor layer 133, and a p-n junction layer 132 located therebetween. The p-type semiconductor layer 131 is formed on and proximate to the first electrode layer 12.

The p-type semiconductor layer 131 is comprised of p-type amorphous silicon (p-a-Si). Preferably, the p-type semiconductor layer 131 is comprised of p-type amorphous silicon with hydrogen (p-a-Si:H). Other than p-a-Si, material used for the semiconductor layer 131 can also includes, but not limited to, subgroup III-V compounds and subgroup II-VI compounds, such as semiconductor material doped with nitrogen (N), phosphor (P), or arsenic (As) element. The semiconductor material doped with N, P, or As element can be gallium-nitrogen (GaN) and gallium indium phosphide (InGaP).

A material used for the p-n junction layer 132 is selected from subgroup III-V compounds and subgroup I-III-VI compounds, such as cadmium-tellurium (CdTe), $CuInSe_2$, CIGS ($CuIn_{1-x}GaSe_2$), etc. In the present embodiment, the p-n junction layer 132 can be formed on the p-type semiconductor layer 131 by a chemical vapor deposition (CVD) process, or a sputtering deposition process. In alternative embodiments, any suitable process known to those skilled in the art and guided by the teachings herein provided may be used. The p-n junction layer 132 is configured for converting photos to hole-electron pairs to form a barrier field.

The n-type semiconductor layer is advantageously comprised, for example, of n-type amorphous silicon (n-a-Si), particularly, n-type amorphous silicon with hydrogen (n-a-Si:H). The material of the n-type semiconductor layer can also be selected from subgroup III-V compounds and subgroup II-VI compounds, such as semiconductor material doped with N, P, or As element. The semiconductor material doped with N, P, or As element can be GaN and InGaP.

It is can be understood that, the semiconductor layer 13 also can be a two-layer structure without the p-n junction layer 132.

The second electrode layer 14 is formed on the n-type semiconductor layer 133. The second electrode layer 14 includes at least one transparent conducting film 141 and metal contacts 142.

A material of the transparent conducting film 141 is selected from the group consisting of ITO (Indium Tim Oxides), zinc oxide (ZnO), tin dioxide ($SnO_2$), $SnO_2$:In, $Ga_2O_3$:Sn, $AgInO_2$:Sn, $In_2O_3$:Sn, $In_2O_3$:Zn, $SnO_2$:Sb, and ZnO:Al. In the present embodiment, a transparent conducting film 141, such as an ITO conducting film, is deposited onto the n-type semiconductor layer 133 in order to transport photo-generated charge carriers and minimize reflection. In the present embodiment, the transparent conducting film 141 can be applied to the n-type semiconductor layer 133 by a sputtering deposition process, a low pressure CVD (LPCVD) process, or a high pressure CVD (HPCVD) process. In alternative embodiments, any suitable process known to those skilled in the art and guided by the teachings herein provided may be used.

In the present embodiment, metal contacts 142 are formed on the transparent conductor layer 141 using a silver screen printing process or a depositing process. Metal contacts 142 are utilized to collect and/or transmit the photo-generated current within solar cell 10 to an external load, for example. Preferably, the metal contacts 142 ohmic contact the transparent conductor layer 141.

Figure 2:
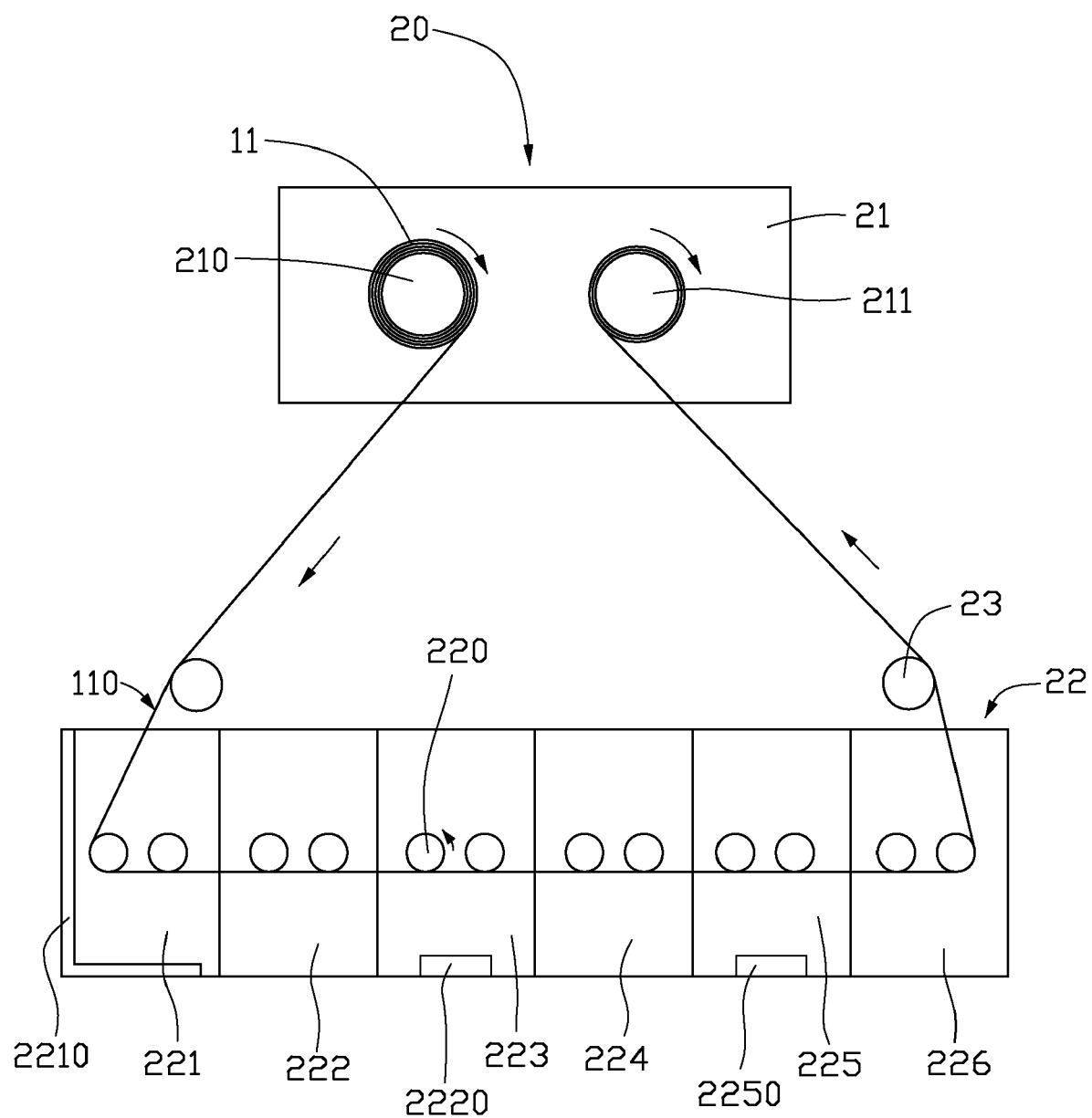
FIG. 2 is a schematic view of an apparatus for manufacturing the solar cell shown in FIG. 1 in accordance with a second present embodiment.

Referring to FIG. 2, an apparatus 20 in order to produce the solar cell 10 mentioned above is provided, according to a second embodiment.

The apparatus 20 includes a loading chamber 21 and a reactor 22. A feed roll 210, a receiving roll 211 set inside the loading chamber 21 and a plurality of rolls 220 set inside the reactor 22, are a continuous roll system where the flexible metallic substrate 11 run through the apparatus 20 and collected thereby. In the production process, the flexible metallic substrate 11 is moved left to right through the reactor 22 via the clockwise rotated feed roll 210, the anti-clockwise rotated rolls 220 and the clockwise rotated receiving roll 211.

The reactor 22 includes a series of treatment zones, where each treatment zone provides a specific treatment regimen in order to produce a specific layer deposition or layer treatment. Each treatment zone allows rolls 220 to transport the flexible metallic substrate 11 into the sequential plurality of treatment zones, until the flexible metallic substrate 11 has been made into the designed solar cell 10. The processing conditions of each treatment zone is determined according which layer of the solar cell 10 being processed. For example, a treatment zone may be configured to perform a sputtering operation, the treatment zone may comprise heat sources and one or more source targets. Each treatment zone may further comprise processing conditions in conjunction with one or more deposition methodologies. The treatment zones are mechanically or operatively linked together within the reactor 22.

In the present embodiment, the reactor 22 includes, a first sputtering zone 221, a first depositing zone 222, a second sputtering zone 223, a second depositing zone 224, a third sputtering zone 225, and a third depositing zone 226. The first sputtering zone 221, the second sputtering zone 223, and the third sputtering zone 225 are configured to perform a sputtering operation, such as AC magnetron sputtering, DC magnetron sputtering, etc., including one or more source targets 2210, 2230, 2250. The first depositing zone 222, the second depositing zone 224, and the third depositing zone 226 are configured to perform a deposition process, such as plasma enhanced CVD, atmospheric pressure CVD, LPCVD, etc. The solar cell 10 is manufactured by providing the flexible metallic substrate 11 through the first sputtering zone 221, the first depositing zone 222, the second sputtering zone 223, the second depositing zone 224, the third sputtering zone 225, and the third depositing zone 226, where sequentially a first electrode layer 12, a p-type semiconductor layer 131, a p-n junction layer 132, an n-type semiconductor layer 133, a transparent conducting film 141, and metal contacts 142 can be formed on the first surface 110 of flexible metallic substrate 11.

The apparatus 20 can further include at least one guiding roll 23 enabling the tension or the transport direction of the flexible metallic substrate 11 to be precisely controlled by the guiding roll 23. In the present embodiment, icy water or other liquid is filled into the rolls 220 in order to cool-off the flexible metallic substrate 11 to be ready for being sputtered or deposited.

Figure 3:
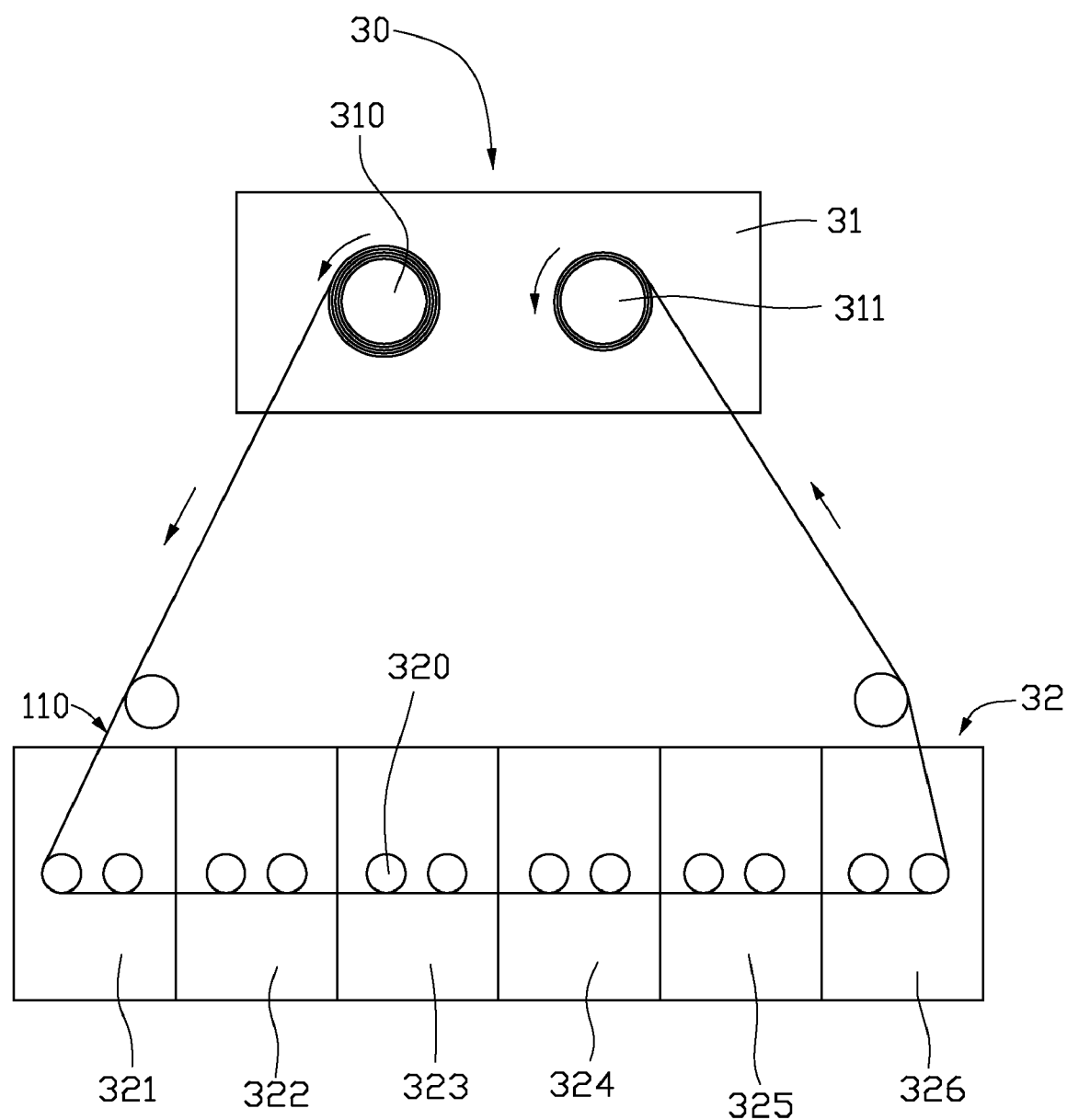
FIG. 3 is a schematic view of an apparatus for manufacturing the solar cell shown in FIG. 1 in accordance with a third present embodiment.

Referring to FIG. 3, an apparatus 30 in order to produce the solar cell 10 is provided, according to a third embodiment. The apparatus 30 is similar to the apparatus 20 of the second embodiment. The reactor 32 includes, a first depositing zone 321, a second depositing zone 322, a third depositing zone 323, a forth depositing zone 324, a fifth depositing zone 325, and a sixth depositing zone 326. The six zones are configured to perform a deposition process. The solar cell 10 is produced by providing the flexible metallic substrate 11 through the first depositing zone 321 to the sixth depositing zone 326, where sequentially a first electrode layer 12, a p-type semiconductor layer 131, a p-n junction layer 132, an n-type semiconductor layer 133, a transparent conducting film 141, and metal contacts 142 can be formed on the first surface 110 of flexible metallic substrate 11. In the production process, the flexible metallic substrate 11 is moved left to right through the reactor 32 via the anti-clockwise rotated feed roll 310, rolls 320 and receiving roll 311.

It is to be understood that the above-described solar cell is not limited to be installed on the roof. Because of its lightweight and flexible properties, it can be widely used in aircraft, shipping, 3C products, such as mobile phone, etc.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A flexible solar cell, comprising:
an Al—Mg alloy substrate,
a first electrode layer formed on the Al—Mg alloy substrate,
a semiconductor layer stack formed on the first electrode layer, wherein the semiconductor layer stack comprises a p-type semiconductor layer, an n-type semiconductor layer, and a p-n junction layer sandwiched between the p-type and n-type semiconductor layers, and the p-type semiconductor layer is formed on and proximate to the first electrode layer, and wherein the p-type semiconductor layer is comprised of p-type amorphous silicon, the n-type semiconductor layer is comprised of n-type amorphous silicon, and a material of the p-n junction layer is selected from the group consisting of subgroup III-V compounds and subgroup I-III-VI compounds, and
a second electrode layer formed on the semiconductor layer stack.

2. The flexible solar cell as claimed in claim 1, wherein a material of the first electrode layer comprises metal.

3. The flexible solar cell as claimed in claim 1, wherein a material of the first electrode layer comprises alloy.

4. The flexible solar cell as claimed in claim 1, wherein a material of the p-n junction layer comprises $CuInSe_2$ or CIGS.

5. The flexible solar cell as claimed in claim 1, wherein the second electrode layer comprises a transparent conducting film formed on the semiconductor layer stack, and a plurality of metal contacts formed on the transparent conducting film.

6. The flexible solar cell as claimed in claim 5, wherein a material of the transparent conducting film is transparent metal oxide.

7. The flexible solar cell as claimed in claim 5, wherein a material of the transparent conducting film is ITO.

8. The flexible solar cell as claimed in claim 1, wherein a material of the first electrode layer is selected from the group consisting of Ag, Cu, Al, Al—Cu alloy, and Cu—Mo alloy.

9. The flexible solar cell as claimed in claim 1, wherein a thickness of the Al—Mg alloy substrate is in a range from about 10 μm to about 100 μm.

* * * * *